United States Patent
Twardy et al.

(10) Patent No.: US 8,431,834 B2
(45) Date of Patent: Apr. 30, 2013

(54) METHOD FOR ASSURING COUNTERBORE DEPTH OF VIAS ON PRINTED CIRCUIT BOARDS AND PRINTED CIRCUIT BOARDS MADE ACCORDINGLY

(75) Inventors: Craig Twardy, Quebec (CA); Robert McDonald, Ontario (CA)

(73) Assignee: Ciena Corporation, Hanover, MD (US)

( * ) Notice: Subject to any disclaimer, the term of this patent is extended or adjusted under 35 U.S.C. 154(b) by 520 days.

(21) Appl. No.: 12/485,375

(22) Filed: Jun. 16, 2009

(65) Prior Publication Data
US 2010/0314163 A1    Dec. 16, 2010

(51) Int. Cl.
*H05K 1/11*    (2006.01)
(52) U.S. Cl.
USPC .......................................................... 174/266
(58) Field of Classification Search .................... 174/266
See application file for complete search history.

(56) References Cited

U.S. PATENT DOCUMENTS

| 4,743,081 | A  | * | 5/1988  | Cobaugh ........................ 439/751 |
| 7,669,321 | B1 | * | 3/2010  | Levy et al. ........................ 29/852 |
| 7,676,920 | B2 | * | 3/2010  | Farkas et al. ..................... 29/852 |
| 7,999,192 | B2 | * | 8/2011  | Chan et al. ...................... 174/262 |
| 2006/0090933 | A1 | * | 5/2006  | Wig et al. ....................... 174/262 |
| 2006/0278429 | A1 | * | 12/2006 | Tourne et al. .................. 174/266 |
| 2008/0087461 | A1 | * | 4/2008  | Farkas et al. ................... 174/266 |
| 2009/0056999 | A1 | * | 3/2009  | Kashiwakura ................ 174/262 |

FOREIGN PATENT DOCUMENTS

| JP | 2005116945 A | * | 4/2005 |
| JP | 2009004585 A | * | 1/2009 |

* cited by examiner

*Primary Examiner* — Timothy Thompson
*Assistant Examiner* — Nathan Milakovich
(74) *Attorney, Agent, or Firm* — Clements Bernard PLLC; Christopher L. Bernard; Lawrence A. Baratta, Jr.

(57) ABSTRACT

A method is disclosed for fabricating a PCB so that is can easily be determined if a via in the PCB has not been counterbored to a desired depth. A PCB fabricated according to the method also is disclosed.

29 Claims, 6 Drawing Sheets

METHOD FOR ASSURING COUNTERBORE DEPTH OF VIAS ON PRINTED CIRCUIT BOARDS AND PRINTED CIRCUIT BOARDS MADE ACCORDINGLY

FIELD OF THE INVENTION

The invention pertains to printed circuit board (PCB) fabrication. More particularly, the invention pertains to counter boring of vias on printed circuit boards.

BACKGROUND OF THE INVENTION

Printed circuit boards are used in many electronic devices for purposes of routing signals between electrical and electronic components that are (1) mounted on the PCB, (2) connected to the PCB via edge connectors, or (3) fabricated directly into the PCB. PCBs generally are flat square or rectangular boards primarily formed of a dielectric material with copper or other conductive traces formed therein to route signals between the various aforementioned electronic components. The term circuitry shall be used herein to refer broadly to any form of electrical or electronic components, including analog components, digital components, ground planes, and simple conductors such as copper traces.

A PCB has two opposing external major surfaces, one or both of which may bear circuitry. In addition, multilayer PCBs are well known in which one or more layers of circuitry are disposed in between the two opposing external major surfaces. Vias are commonly used to connect signals on any one of these layers to any other one of these layers. A via essentially is a hole that is drilled or otherwise formed in the PCB between any two layers and plated or filled with copper or another conductor. Due to ease of fabrication issues, vias typically are drilled completely through the PCB even if the via is used to connect circuitry on two internal layers or one of the two external layers (topmost layer or bottommost layer) and an internal layer.

"Backplane" is the common terminology used for specific type of PCB found in many electronic devices, such as computers, that is usually large in size (e.g., greater than about 9 inches per edge) and that contains connectors on the edge of the PCB into which additional electronic components may be plugged, such as computer peripheral cards (often called plug-in cards).

Commonly, the edge connectors on the PCB for connecting a plug-in card or other electronic component or device are installed on the surface or edge of the PCB and connected to signals on other layers with vias. Specifically, one common method is to install a connector comprising a conductive pin that extends into the via hole from one of the external major surfaces of the PCB that makes electrical contact with the metalized wall of the via. These metal pins are called press-fit pins and rely on mechanical forces to ensure electrical connection.

Vias generally comprise a change point in signal flow that tends to cause a great deal of signal degradation, particularly with respect to signals in the radio and microwave frequency range, and more specifically signals having frequencies over 100 MHz. Vias generally look like a capacitance to high frequency signals passing therethrough. A copper trace on a PCB typically has an impedance of 50 for a single ended trace or 100 ohms for differential signals, whereas a via typically has a much lower impedance, that impedance being primarily capacitive. Typically, the longer the via, the greater the capacitance and, therefore, the greater the signal degradation. This problem is particularly acute with respect to vias used for connectors because such vias must have a certain close spacing (usually standardized) in order to properly mate with the connector pins of a plug-in card. Also, the backplanes on which such connector vias are commonly found tend to be rather thick PCBs because they commonly must accommodate a large number of layers due to the need to route a large number of signals over the PCB.

Accordingly, it is common practice in PCB fabrication to drill vias completely through the PCB, plate the entire via with copper or another conductive material, and then counterbore the vias to remove the unnecessary copper therein. The unnecessary copper in any given via is the copper that runs between any layers of the PCB that are not being electrically interconnected by that via. For instance, if a particular via is provided to interconnect the topmost external layer with the second topmost, internal layer of the PCB, then the via would be counterbored from the bottommost external layer up to but just short of the second topmost layer.

Figure 1A:
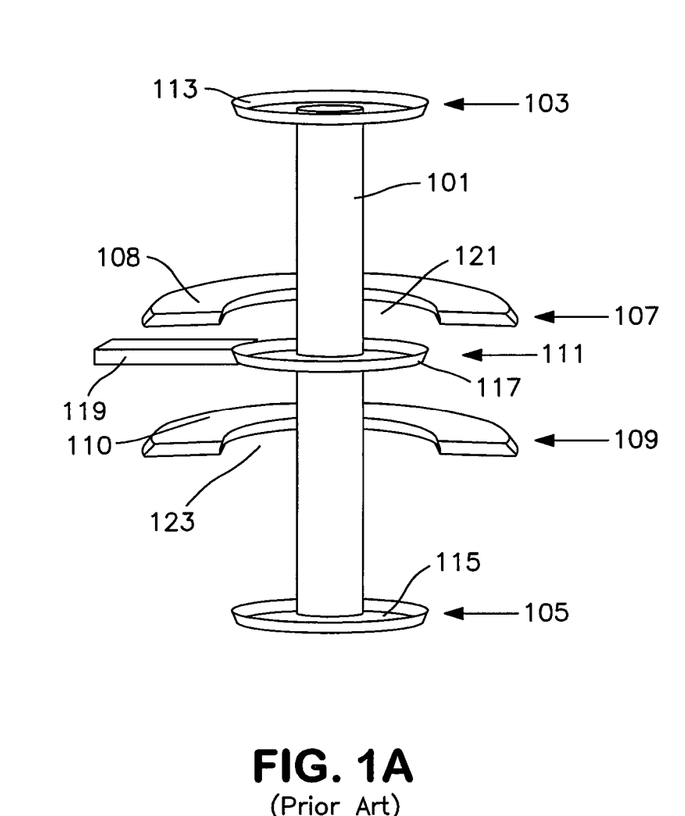
FIGS. 1A and 1B are elevation views of a conventional via in a PCB before and after counterboring, respectively.
Figure 1B:
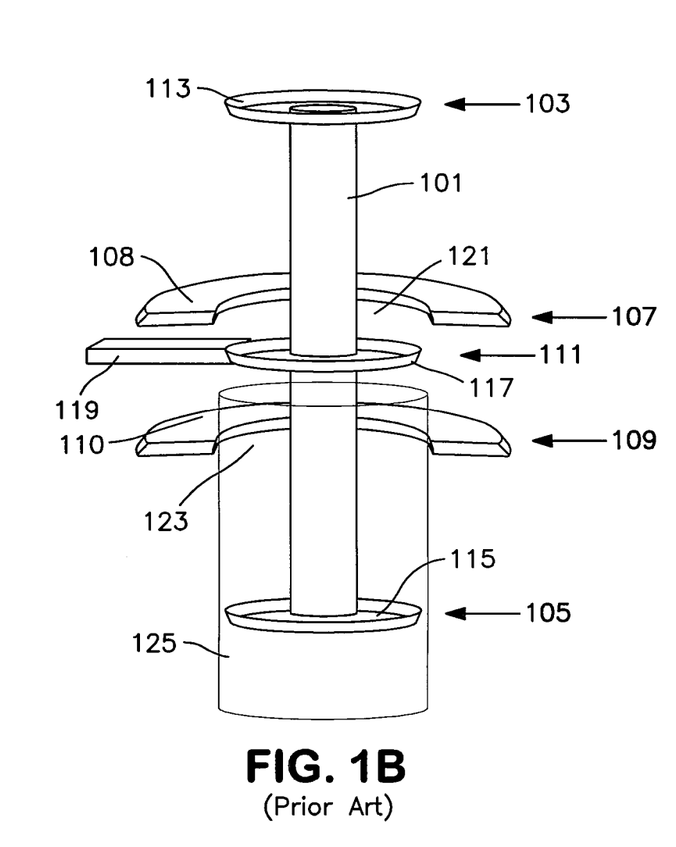

For instance, FIGS. 1A and 1B show a conventional via before and after counterboring. In these Figures, the actual PCB dielectric material is not shown for sake of clarity. However, it will be understood that the spaces between the conductive layers are occupied by the PCB dielectric material. In this example, the via 101 is a copper plated hollow tube running the entire depth of the PCB. This PCB has five conductive layers, namely, top external layer 103, bottom external layer 105, a first ground plane layer 107, a second ground plane layer 109 and a signal layer 111 sandwiched between the two ground plane layers 107, 109. The ground plane layers 107 and 109 generally are each essentially complete sheets of copper 108, 110, respectively, that substantially occupy the entire layer except for areas 121, 123 immediately surrounding the vias since, generally, each via forms part of a signal path between two electronic components and, therefore should not be shorted to ground. These areas around the vias that do not comprise copper are commonly called anti-pads 121, 123. On the top and bottom layers 103 and 105 and any signal layer, such as signal layer 111, to which the via 101 is to make a connection, a copper pad is formed around and in contact with the copper plating of the via. See, for instance, top pad 113, bottom pad 115 and signal layer pad 117. A signal trace 119 connects to the signal layer pad 117 for carrying a signal and/or from the via 101 between the two (or more) electronic components that are to be connected using the via as part of the signal path therebetween, In theory, signal lines like trace 119, can run right up to the via 101 and the pads 113, 115, 117 can be eliminated. However, the use of pads such as pads 113, 115, and 117 allows for lower manufacturing tolerances in terms of at least, position of the via and the signal traces. In this example, the via is to a connector that is to connect a signal placed on the top pad 113 by connecting a press fit pin of the connector to the signal path 119 in the signal layer 111.

After the via is fully formed as shown in FIG. 1A, the via is counterbored by drilling with a drill having a larger diameter than the via 101 from the bottom surface 105 up to, but just short of, the signal layer 111. The shaded cylinder 125 in FIG. 1B represents the portion of the via and PCB that is removed by the counterboring drill. As can be seen, this counterboring eliminates almost all of the copper in the via between the bottom layer 105 and the signal layer 111, all of which is unnecessary for purposes of connecting the top pad 113 to the signal trace 119 in the signal layer 111. However, there is some copper left below signal layer 111 simply because the drilling can be performed only to certain practical tolerances and, therefore, room for such tolerance errors must be designed into the drilling operation to assure that the drill does not inadvertently drill into the signal layer 111, which would break the desired signal path from the top pad 113 of the via to the signal path 119 in signal layer 111. On the other hand, if the drill does not drill far enough, then more copper will remain in the via than is necessary, leading to increased signal degradation.

It can readily be detected if the drill drills too far by simple resistive testing. Specifically, an ohmmeter can be placed across the top pad 113 and the destination of signal trace 119. If an open circuit is detected, the pad 117 has been breached and the PCB is defective. However, there is no easy way to determine if the drill did not drill as deeply as desired (so that the signal degradation caused by the via is greater than it needs to be). While there are ways to determine if the counterbore has not been drilled deep enough, they are not practical for standard PCB testing. For instance, the depth of the counterbore can be determined visually by observation with a microscope. However, this is not a solution that can be reasonably implemented on a production scale because of the labor and cost involved. It also is possible to test the via by placing a high frequency signal across the via and testing the output for signal degradation. However, this also is a time consuming and expensive proposition that is not reasonable to implement on a production scale.

SUMMARY OF THE INVENTION

A method is disclosed for fabricating a PCB so that is can easily be determined if a via in the PCB has not been counterbored to a desired depth. The method involves adding a conductive structure to the PCB prior to counterboring of the via that initially electrically connects the via to a layer of the PCB to which the via is not suppose to be connected when fabrication is completed and, after counterboring the via, testing the electrical continuity of the via to that layer. A PCB fabricated according to the method also is disclosed.

DETAILED DESCRIPTION OF THE INVENTION

Figure 2A:
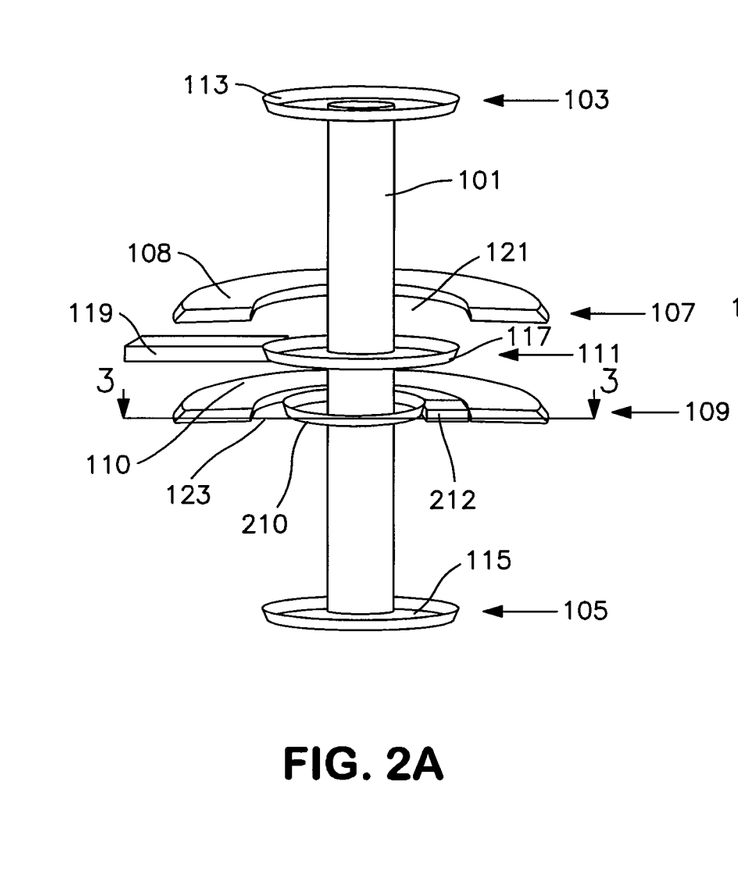
FIGS. 2A and 2B are elevation views of a via in a PCB fabricated in accordance with the principles of a first embodiment of the invention before and after counterboring, respectively.
Figure 2B:
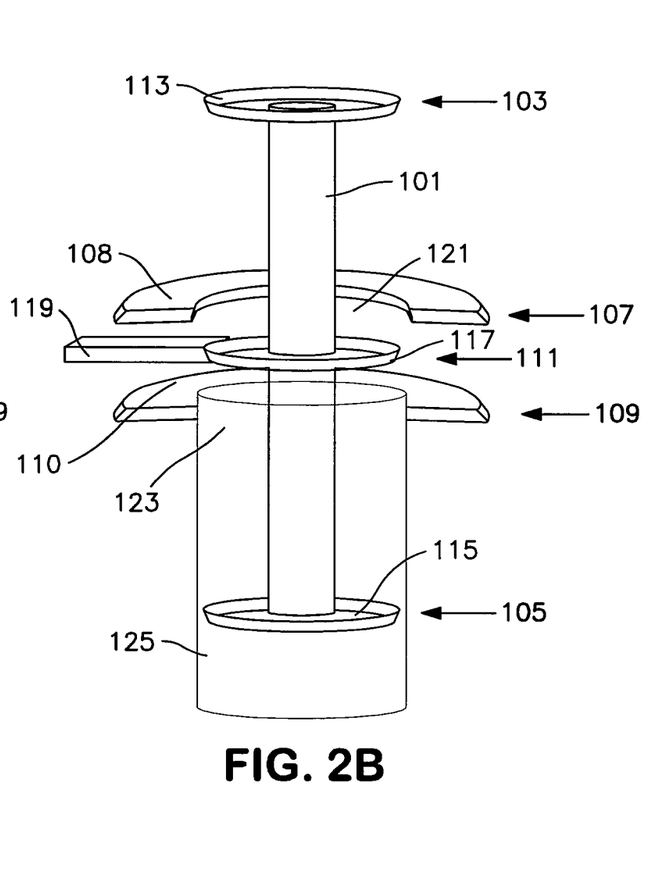

FIGS. 2A and 2B are elevation views before and after counterboring, respectively, of a via similar to the one shown in FIGS. 1A and 1B, but modified in accordance with the principles of a first embodiment of the present invention. Most of the features shown in FIGS. 2A and 2B are the same as features shown in FIGS. 1A and 1B. Hence, like components have been labeled with the same reference numerals in FIGS. 2A and 2B as in FIGS. 1A and 1B.

With reference to FIG. 2A, the top layer 103, the bottom layer 105, the upper ground plane layer 107, and the signal layer 111 are essentially unchanged from FIGS. 1A and 1B. However, the lower ground plane layer 109 differs in that, in the middle of the anti-pad 123, a conductive pad 210 has been added surrounding the via (similar in nature to pad 117 in the signal layer 111. This pad makes contact with the copper in the via 101. Furthermore, a signal path 212 has been added that runs the short distance through the anti-pad area 123 between the pad 210 and the ground plane copper 110. This connection of the via 101 to the ground plane 109 through pad 210 and trace 212 essentially short circuits to ground the signal that is supposed to be carried on trace 119 in the signal layer 111. This, of course, is undesirable in operation. However, this short circuit will be eliminated if and when the via 101 is properly counterbored as shown in FIG. 2B. That is, as is conventional, the via will be counterbored from the bottom surface 105 up to but just short of the signal plane 111 in order to eliminate as much of the excess, unnecessary conductor in the via 101 as possible. As discussed above in connection with FIGS. 1A and 1B, that excess conductor is essentially all of the conductor below the signal plane 111. Ideally, the counterbore reaches as close as possible to the signal layer 111 without breaching the pad 117 in the signal layer.

As previously mentioned in connection with FIGS. 1A and 1B, after the via has been counterbored, it can be easily determined if the counterbore was drilled to deep and has breached the signal layer by means of a simple impedance test between the top pad 113 and the destination/source node of trace 119 in the signal layer. Particularly, if that impedance test measures an open circuit, then the counterbore is too deep and has breached the signal layer rendering the PCB defective. If, on the other hand, it measures a short circuit, then the counterbore has not reached deep enough.

However, there has been no cost- or time-effective way in the prior art to determine if the counterbore has been drilled too shallow, such that too much conductor remains below the signal layer 111. In accordance with this embodiment, the placement of the pad 210 and trace 212 in the layer 109 directly beneath the signal layer 111 provides a simple way to determine if the counterbore is too shallow and, more specifically, to determine if the counterbore reached at least the layer 109 directly beneath the signal layer 111. Specifically, it can be determined whether the counterbore extends at least to the layer 109 by another simple impedance test, this time between the top pad 113 and ground plane 109. If the counterbore did not at least reach ground plane layer 109, then the pad 210 and trace 212 will remain in layer 109 shorting the via 101 to ground. On the other hand, if the counterbore at least reached into layer 109, then at least a portion of pad 210 and/or trace 212 will have been destroyed by the counterbore, thereby disrupting the electrical connection between the via 101 and ground. Thus, if the impedance test shows a short circuit between top pad 113 and ground, it means that the counterbore has not been drilled deep enough because it does not extend past the layer 109 underlying the signal layer. If, on the other hand, the impedance test reveals an open circuit between top pad 113 and ground, then the counterbore does, in fact, at least reach layer 109. Thus, if the first impedance test shows a short circuit between the top pad 112 and the signal destination/source of trace 119 in the signal layer and the second impedance test shows an open circuit between top pad 113 and ground, the counterbore has been drilled to a reasonable depth.

In the example illustrated in FIGS. 2A and 2B, several exemplary assumptions have been made. First, it has been assumed that the depth between ground plane layer 109 and signal layer 111 is large enough that the counterbore should extend past layer 109. It also has been assumed that the depth between layer 109 and layer 111 is small enough that it is satisfactory if the counterbore extends at least through that layer 109. However, these are merely exemplary assumptions. Neither is a requirement. For instance, if the former assumption is not reasonable, i.e., the distance between layer 109 and layer 111 is too small to expect every good counterbore to breach layer 109 and not breach layer 111, then a different layer may be chosen that is farther away from layer 111 in which to add the extra pad 210 and trace 212. In FIGS. 2A and 2B, there is only one layer between the signal layer 111 and bottom external layer 105. However, commonly, there will be more layers and the additional structure may be added in any of those layers. There is no requirement that the layer in which the additional structure is added be a next adjacent layer.

On the other hand, layer 109 were too far away from layer 111, the design of the PCB could be modified to reduce the depth between the layers or to add another layer to the design the sole purpose of which is to add testing structure such as pad 210 and trace 212. This type of design is discussed in more depth in connection with FIG. 6.

Figure 3:
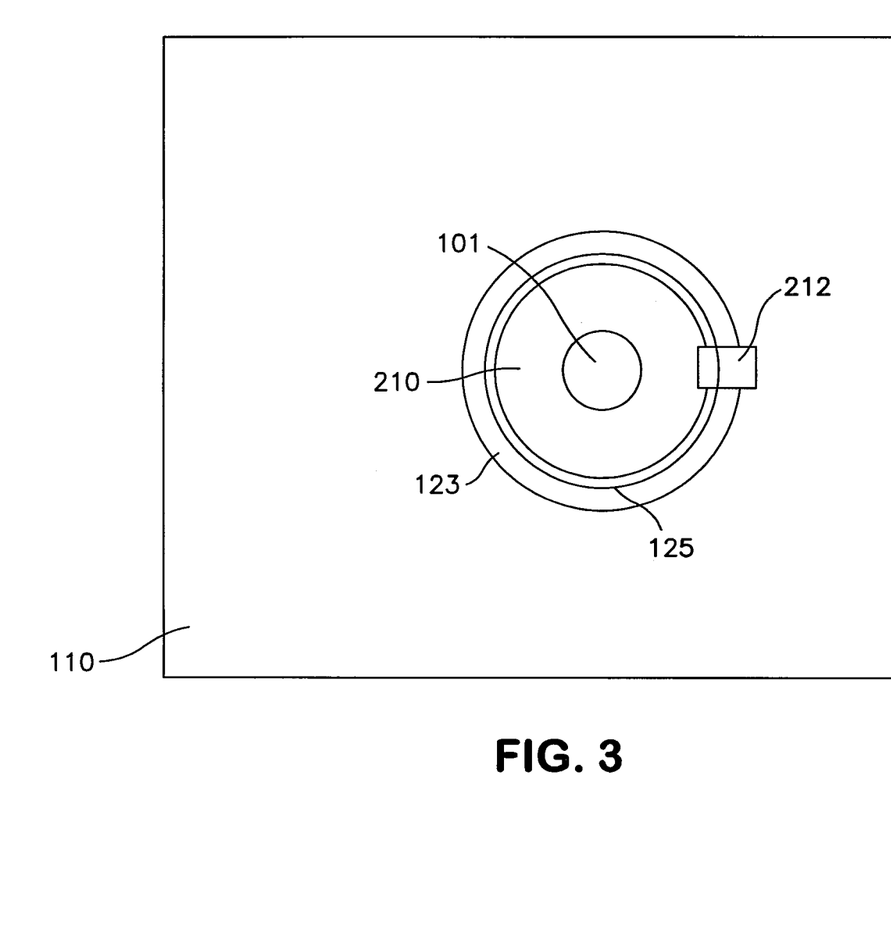
FIG. 3 is a cross-sectional plan view of the PCB of FIGS. 2A and 2B taken through section line 3-3 in FIG. 2A.

FIG. 3 is a cross sectional plan view taken along line 3-3 in FIG. 2A. It is, in essence, a plan view of the ground plane layer 109. As can be seen the pad 210 and trace 212 are in the anti-pad area 123 in ground plane 109. Collectively, the pad 210 and trace 212 electrically connect the via 101 to the ground plane 109. The circle 125 represents the diameter of the counterboring drill. It can be seen that, if the counterbore reaches ground plane layer 109, it will completely eliminate the pad 210 as well as a portion of the trace 212. It is only necessary that the counterbore diameter be sufficient to break the conductive continuity between the via 101 and the ground metal 110. Thus, the drill diameter could actually be smaller that the diameter of the pad 210 or larger than the diameter of the anti-pad 123.

In an alternative embodiment, it is not necessary to add a specific pad 210 and/or trace 212 in ground plane layer 109. Rather, the anti-pad 123 could simply be eliminated so that the ground plane metal 110 reached right up to the via 101. The counterbore would still break the conductive path between the via and the ground plane metal 110.

Furthermore, while the invention had been illustrated so far with the additional structure in a ground plane, that feature also is merely exemplary. There is no reason that the pad 210 and trace 212 (or other structure) could not be added to any other type of layer, such as a signal layer. The only requirement is that the additional structure conductively connect the via to an electrical node of the PCB that is accessible for purposes of impedance testing.

Figure 4A:
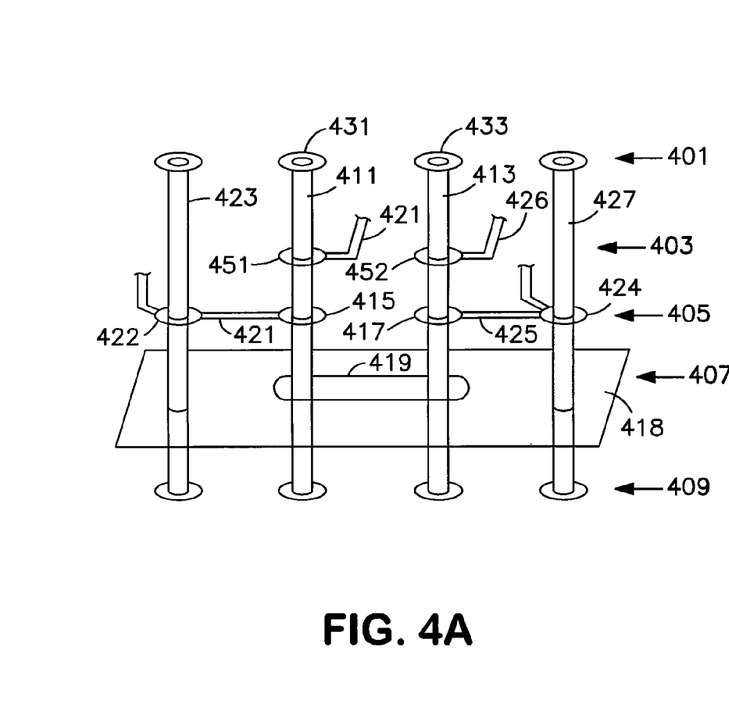
FIG. 4A is an elevation view of a PCB in accordance with the principles of an alternate embodiment of the invention.
Figure 4B:
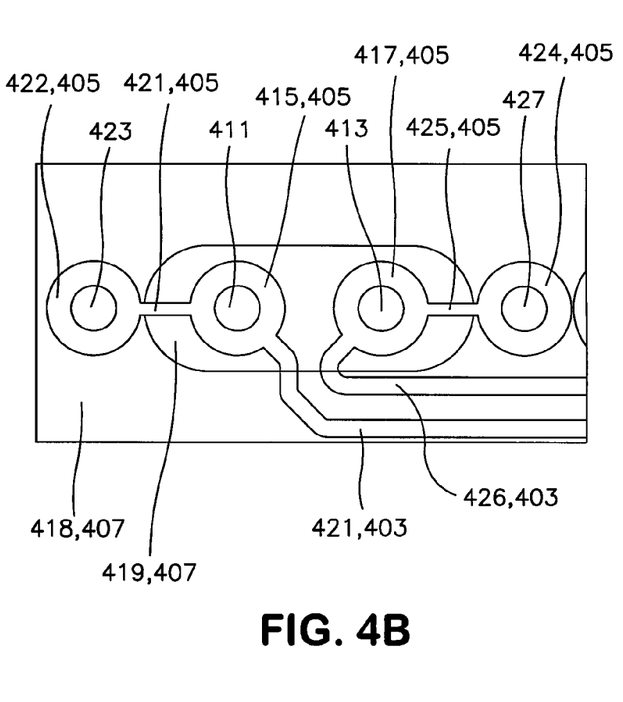
FIG. 4B is a see-through, plan view of multiple layers of the PCB of FIG. 4A.

FIGS. 4A and 4B, for instance, are elevation and plan views, respectively, of an alternative embodiment in which the additional counterbore-depth-testing structure is added to a signal layer. In this embodiment, the layers in the PCB include top, external layer 401, first signal layer 403, second signal layer 405, ground plane layer 407, and bottom, external layer 409. FIGS. 4A and 4B illustrate two vias 41 land 413 that will be counterbored. The plan view of FIG. 4B is not a pure cross sectional view, but rather a view showing structure in each of layers 403, 405, and 407. Top and bottom layers 401 and 409 are not represented in FIG. 4B in order not to obfuscate the features and points being illustrated. In FIG. 4B, each element is labeled with the reference numeral corresponding to the element as well as the reference numeral of the layer in which it is formed. The vias, of course, pass through all of the layers and, therefore, do not have a layer reference numeral.

Vias 411 and 413 are within a shared oval anti-pad 419 in the ground metal 418 of ground plane layer 407, as is common. The two vias 411 and 413, for example, serve the purpose of carrying the two ends of a differential signal to a destination node (not shown in the Figures) in layer 403 through pads 451 and 452 and signal traces 421 and 426, respectively, in first signal layer 403. Accordingly, it is desired to counterbore vias 411 and 413 from the bottom external surface 409 up to a depth between the second signal layer 405 and the first signal layer 403. Accordingly, it would be desirable to position the additional structure for counterbore depth testing in layer 405. Thus, in accordance with one particular embodiment, pads 415 and 417 are added surrounding vias 411 and 413 in second signal layer 405.

Furthermore, a signal trace 421 is added running between pad 415 and a pad 422 in layer 405 surrounding and connected to a ground pin via 423 and another trace 425 is added between pad 417 and another pad 424 in layer 405 surrounding and connected to another ground pin via 427. As noted, vias 423 and 427 are ground pin vias and therefore make contact with the ground plane of layer 407. Such pins are already commonly formed in PCBs for purposes unrelated to any inventive features introduced in this specification.

In accordance with this embodiment, the depth of the counter bore can be assured to extend from the bottom layer 409 to a depth between first signal layer 403 and second signal layer 405 by testing continuity between each top pad 431, 433 of vias 411 and 413 on the top, external layer 401 of the PCB and any ground connection.

Even further, while the embodiments discussed herein above have all involved short circuiting vias to ground, that too is merely exemplary. As previously mentioned, the continuity that must be broken need not necessarily be to ground. Ground is merely frequently a convenient node, but the added structure can provide connectivity to any node on the PCB that can be accessed directly or indirectly for purposes of impedance testing.

Figure 5A:
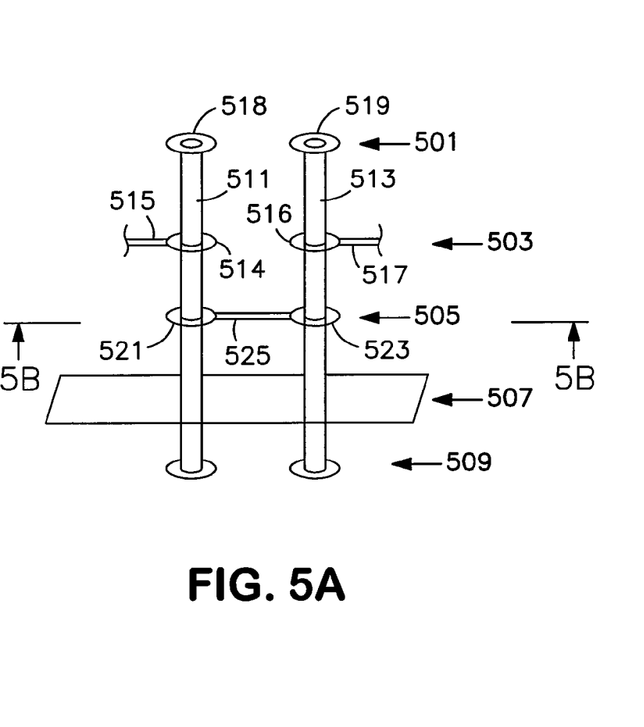
FIG. 5A is an elevation view of a PCB in accordance with the principles of another alternate embodiment of the invention.
Figure 5B:
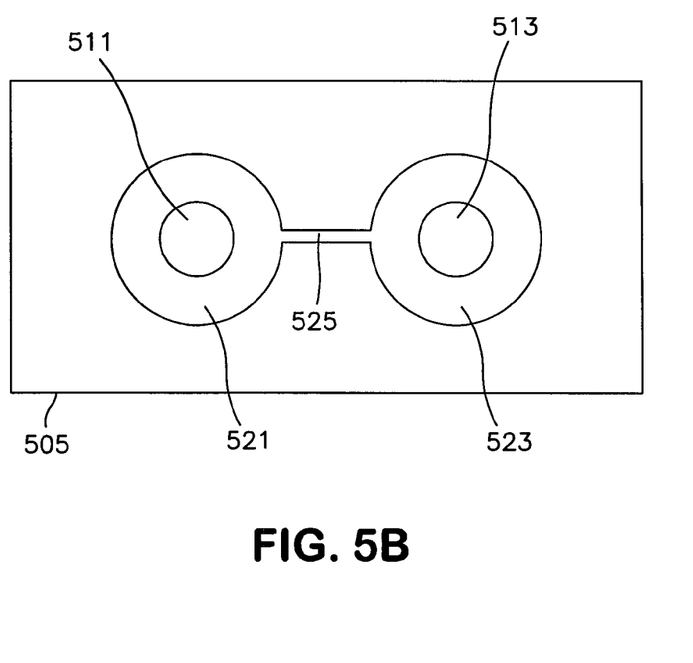
FIG. 5B is a cross sectional plan view of the PCB of FIG. 5A taken through line 5B-5B in FIG. 5A.

FIGS. 5A and 5B illustrate yet another embodiment of the invention in which the added structure does not connect the via(s) that are to be counterbored and tested to ground. FIG. 5A is an elevation view of the PCB and FIG. 5B is a cross sectional view taken along line 5B-5B in FIG. 5A. FIG. 5B, therefore, is essentially a plan view of layer 505. In this embodiment, the added counterbore-testing structure comprises pads and a trace that electrically connected these two vias to each other in the layer adjacent to the layer on which those vias are to carry signals to and/or from during operation. Particularly, this exemplary embodiment comprises five layers, including a top, external layer 501, a first signal layer 503, a second signal layer 505, a ground plane layer 507, and a bottom, external layer 509. In this embodiment, vias 511 and 513 carry the two ends, respectively, of a differential signal between top pads 518 and 519, respectively, and signal destinations (not shown) on first signal layer 503 through pads 514 and 516 and signal traces 515 and 517, respectively. In accordance with this embodiment, pads 521 and 523 surrounding vias 511 and 513, respectively, and a trace 525 running between pads 521 and 523 are all added in second signal layer 505 so that the two vias 511 and 513 are shorted to each other in second signal layer 505. Thus, if the counterbore is deep enough (i.e., between first and second signal layers 503 and 505, then, it will disconnect the short circuit between vias 511 and 513 in layer 505. Thus, a simple impedance test between top pad 518 of via 511 and top pad 519 of via 513 will reveal if the via has been counter bored past layer 505. Of course, it also can be determined if the counter bore was drilled too deeply so as to breach layer 503 by further testing continuity between each of vias 511 and 513 and the respective signal destinations of traces 515 and 517, respectively.

Figure 6:
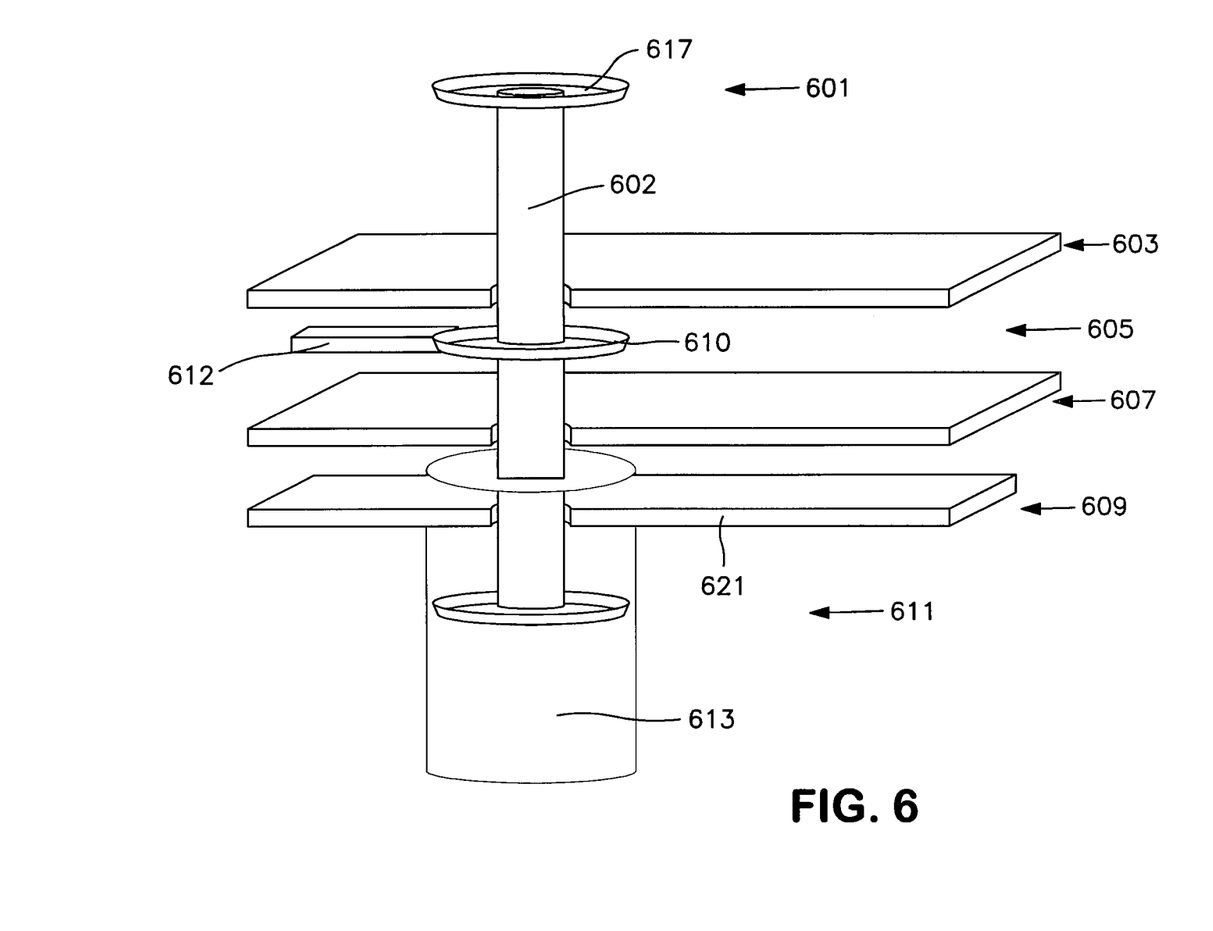
FIG. 6 is an elevation view of a PCB in accordance with the principles of yet another alternate embodiment of the invention.

FIG. 6 is an elevation view of another embodiment illustrating the concept of adding a conductive layer to the PCB strictly for the purpose of counterbore depth testing. This embodiment has six layers, including top layer 601, first ground plane layer 603, signal layer 605, second ground plane layer 607, testing layer 609, and bottom, external layer 611. Also, the diameter and desired depth of the counter bore is shown at 613.

Layer 609 is an additional layer that has been added solely for the purpose of providing a layer that can be used in testing counter boring depths. Particularly, as previously mentioned in connection with the discussion of FIGS. 2A and 2B, the traditional design of a particular PCB may not provide any layer that is appropriately spaced from signal layer 605 to provide depth testing that is deemed adequate. For instance, ground plane layer 607 may be too close to signal layer 605 to expect the counter boring drill to drill past that layer but not into the signal layer 605. If there were another layer beneath second ground plane layer 607 in the normal design of the PCB, that layer might be too far away from signal layer 605. Accordingly, a layer such as layer 609 may be added for the purpose of allowing testing of counter boring depth with respect to vias, such as via 602, that carry signals to and/or from the signal layer 605 through pad 610, and trace 612 and top pad 617. As shown, the metal 621 on layer 609 may be wholly continuous so that it contacts the via 602 without the need to fabricate anti-pads and pads within those anti-pads with small traces connecting the pad to the main metal on that layer.

Furthermore, the additional layer 609 need not necessarily strictly be a conductor such as copper. It could be a resistive or capacitive material (all of which exist in PCB fabrication). For instance, layer 609 could be formed of a material that provides 50 ohms of impedance and is coupled to ground. Then, standard test equipment may determine if there is a 50 ohm impedance between top pad 617 and ground before counter boring and then determined if there is an open circuit after counter boring. This would indicate first that the additional layer 609 has been properly formed and that, after counter boring, the counterbore drill has reached past that layer, thereby breaking the connection to ground.

While the invention has been described above primarily in connection with the drilling of counterbores, this is merely exemplary. The invention may be applied in PCBs in which the counter bores are formed by any other present or future techniques. Furthermore, the invention has primarily been described above in connection with structure that conductively connect a via to an electrical node on the PCB. However, the additional structure need not necessarily even provide a conductive connection to another node on the PCB. Embodiments are envisioned in which the additional structure for helping determine counter boring depth provides an inductance or a capacitance between the via and a node of the PCB that can be accessed for capacitance or inductance testing. Essentially any form of electromagnetic coupling that can be disrupted or altered in a measurable way by removing the additional structure is possible.

Having thus described a few particular embodiments of the invention, various alterations, modifications, and improvements will readily occur to those skilled in the art. Such alterations, modifications, and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

The invention claimed is:

1. A method of determining a depth to which a via in a printed circuit board (PCB) has been counterbored, the via intended to carry signals between a first conductive layer and a second conductive layer of the PCB, comprising:
fabricating a structure in a third conductive layer of the PCB that couples the via electromagnetically to a first node on the PCB, the structure positioned so that the electromagnetic coupling to the first node will be disrupted if the via is counterbored through the third conductive layer;
counterboring the via; and
testing for the electromagnetic coupling between the first node and the via;
wherein the structure that is fabricated in the third conductive layer of the PCB that couples the via electromagnetically to the first node on the PCB comprises a trace that spans a portion of an anti-pad, and wherein at least a portion of the trace is removed when the via is counterbored through the third conductive layer.

2. The method of claim 1 wherein the electromagnetic coupling is a conductive connection.

3. The method of claim 2 wherein the testing comprises testing for electrical continuity between the via and the first node.

4. The method of claim 2 wherein fabricating the structure comprises fabricating a pad surrounding the via and a conductive trace between the pad and the first node.

5. The method of claim 2 wherein the first node is a ground node of the PCB.

6. The method of claim 2 wherein the third conductive layer is an adjacent conductive layer to the second conductive layer.

7. The method of claim 2 wherein the third conductive layer is a non-adjacent conductive layer to either the first conductive layer or the second conductive layer.

8. The method of claim 2 wherein the third conductive layer has a purpose in the PCB other than supporting the structure.

9. The method of claim 2 wherein the structure connects the via to another via in the PCB.

10. The method of claim 2 wherein the PCB comprises first and second vias and the structure comprises a conductive trace between the first and second vias and the testing comprises testing electrical continuity between the first and second vias.

11. The method of claim 1 wherein the via is an edge connector for an external device.

12. The method of claim 1 wherein the via is an edge connector for a plug-in card.

13. The method of claim 1 further comprising: testing for electromagnetic coupling of the via to the second conductive layer.

14. The method of claim 13 wherein the testing of electromagnetic coupling of the via to the second conductive layer comprises testing for conductive continuity of the via with a second node on the second layer.

15. A method of testing a printed circuit board (PCB) to assure that a via in the PCB has been counterbored to a desired depth, the via intended to carry signals between a first conductive layer and a first node on a second conductive layer of the PCB, comprising:

fabricating a structure in a third conductive layer of the PCB that provides a conductive connection of the via to a second node on the PCB, the structure positioned so that the conductive connection of the via to the second node will be disrupted if the via is counterbored through the third conductive layer;

counterboring the via;

after counterboring, testing for conductivity between the first node and the via;

after counterboring, testing for conductivity between the second node and the via; and rejecting the PCB if either (a) there is no conductivity between the via and the first node or (b) there is conductivity between the via and the second node;

wherein the structure that is fabricated in the third conductive layer of the PCB that couples the via electromagnetically to the second node on the PCB comprises a trace that spans a portion of an anti-pad, and wherein at least a portion of the trace is removed when the via is counterbored through the third conductive layer.

16. The method of claim 15 wherein fabricating the structure comprises fabricating a pad surrounding the via and a conductive trace between the pad and the second node.

17. The method of claim 15 wherein the second node is a ground node of the PCB.

18. The method of claim 15 wherein the PCB comprises first and second vias and wherein the fabricating the structure comprises fabricating a conductive trace between the first and second vias and wherein the testing comprises testing electrical continuity between the first and second vias.

19. The method of claim 15 wherein the via is an edge connector for an external device.

20. A method of fabricating a printed circuit board (PCB) so as to permit determination of whether a via in the PCB has been counterbored to at least a minimum depth, comprising:

fabricating a PCB comprising at least a first conductive layer, a second conductive layer, and a third conductive layer, wherein the third conductive layer is not between the first conductive layer and the second conductive layer;

fabricating a conductive via extending through the PCB, the via intended to carry signals between a first node on the first conductive layer and a second node on the second conductive layer of the PCB;

fabricating a structure in the third conductive layer of the PCB that provides electromagnetic coupling of the via to a third node on the PCB, the structure positioned so that the electromagnetic coupling of the via to the third node will be disrupted if the via is counterbored through the third conductive layer;

counterboring the via;

wherein the structure that is fabricated in the third conductive layer of the PCB that provides electromagnetic coupling of the via to the third node on the PCB comprises a trace that spans a portion of an anti-pad, and wherein at least a portion of the trace is removed when the via is counterbored through the third conductive layer.

21. The method of claim 20 further comprising:

after counterboring, testing for conductivity between the first node and second node through the via;

after counterboring, testing for electromagnetic coupling between the third node and the via; and rejecting the PCB if either (a) there is no conductivity between the via and the first node or (b) there is conductivity between the via and the third node.

22. The method of claim 20 wherein the electromagnetic coupling is a conductive connection.

23. The method of claim 22 wherein fabricating the structure comprises fabricating a pad surrounding the via and a conductive trace between the pad and the third node.

24. A printed circuit board (PCB) comprising:

a first conductive layer;

a second conductive layer;

a third conductive layer, the third conductive layer comprising a ground plane, the third conductive layer not between the first conductive layer and the second conductive layer;

a via extending through the PCB, the via intended to carry signals between a first node on the first conductive layer and a second node on the second conductive layer; and a structure in the third conductive layer of the PCB that conductively connects the via to the ground plane, the structure positioned so that the conductive connection of the via to the ground plane will be disrupted if the via is counterbored through the third conductive layer;

wherein the structure in the third conductive layer of the PCB that conductively connects the via to the ground plane comprises a trace that spans a portion of an anti-pad, and wherein at least a portion of the trace is removed when the via is counterbored through the third conductive layer.

25. The PCB of claim 24 wherein the structure comprises a pad surrounding the via and a conductive trace between the pad and the ground plane.

26. The PCB of claim 24 wherein the third conductive layer is an adjacent conductive layer to the second conductive layer.

27. The PCB of claim 24 wherein the PCB comprises first and second vias and the structure comprises a conductive trace between the first and second vias and the testing comprises testing electrical continuity between the first and second vias.

28. The PCB of claim 24 wherein the via is an edge connector for an external device.

29. A printed circuit board (PCB) comprising:

a first conductive layer;

a second conductive layer;

a third conductive layer not between the first conductive layer and the second conductive layer;

a via extending through the PCB, the via intended to carry signals between a first node on the first conductive layer and a second node on the second conductive layer, the via comprising a non-conductive, counterbored portion and a conductive, non-counterbored portion, the counterbored portion extending into the third conductive layer; and a conductive structure in the third conductive layer in conductive contact with a third node and in physical contact with the counterbored portion of the via;

wherein the conductive structure in the third conductive layer that is in conductive contact with the third node and in physical contact with the counterbored portion of the via comprises a trace that spans a portion of an anti-pad, and wherein at least a portion of the trace is removed when the via is counterbored through the third conductive layer.

* * * * *